United States Patent
Lei et al.

(10) Patent No.: US 8,652,940 B2
(45) Date of Patent: Feb. 18, 2014

(54) WAFER DICING USED HYBRID MULTI-STEP LASER SCRIBING PROCESS WITH PLASMA ETCH

(71) Applicant: Applied Materials, Inc., Santa Clara, CA (US)

(72) Inventors: Wei-Sheng Lei, San Jose, CA (US); Brad Eaton, Menlo Park, CA (US); Madhava Rao Yalamanchili, Morgan Hill, CA (US); Saravjeet Singh, Santa Clara, CA (US); Ajay Kumar, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/851,442

(22) Filed: Mar. 27, 2013

(65) Prior Publication Data
US 2013/0267076 A1 Oct. 10, 2013

Related U.S. Application Data

(60) Provisional application No. 61/622,398, filed on Apr. 10, 2012.

(51) Int. Cl.
*H01L 21/00* (2006.01)
(52) U.S. Cl.
USPC ........................................................ 438/460
(58) Field of Classification Search
USPC ........................................................ 438/460
See application file for complete search history.

(56) References Cited

U.S. PATENT DOCUMENTS

| 4,049,944 | A | 9/1977 | Garvin et al. |
| 5,593,606 | A | 1/1997 | Owen et al. |
| 6,057,180 | A | 5/2000 | Sun et al. |
| 6,174,271 | B1 | 1/2001 | Kosmowski |
| 6,306,731 | B1 | 10/2001 | Igarashi et al. |
| 6,407,363 | B2 | 6/2002 | Dunsky et al. |
| 6,465,158 | B1 | 10/2002 | Sekiya |
| 6,528,864 | B1 | 3/2003 | Arai |
| 6,574,250 | B2 | 6/2003 | Sun et al. |
| 6,582,983 | B1 | 6/2003 | Runyon et al. |

(Continued)

FOREIGN PATENT DOCUMENTS

| EP | 1649965 | 4/2006 |
| JP | 9216085 | 8/1997 |

(Continued)

OTHER PUBLICATIONS

International Search Report and Written Opinion for PCT Patent Application No. PCT/US2013/034841 mailed Jul. 1, 2013, 10 pgs.

(Continued)

*Primary Examiner* — Bradley K Smith
(74) *Attorney, Agent, or Firm* — Blakely Sokoloff Taylor Zafman LLP

(57) ABSTRACT

Methods of dicing semiconductor wafers, each wafer having a plurality of integrated circuits, are described. A method includes forming a mask above the semiconductor wafer. The mask is composed of a layer covering and protecting the integrated circuits. The mask is patterned with a multi-step laser scribing process to provide a patterned mask with gaps. The patterning exposes regions of the semiconductor wafer between the integrated circuits. The semiconductor wafer is then etched through the gaps in the patterned mask to singulate the integrated circuits.

20 Claims, 10 Drawing Sheets

(56) References Cited

U.S. PATENT DOCUMENTS

| | | |
|---|---|---|
| 6,593,542 B2 | 7/2003 | Baird et al. |
| 6,642,127 B2 | 11/2003 | Kumar et al. |
| 6,676,878 B2 | 1/2004 | O'Brien et al. |
| 6,696,669 B2 | 2/2004 | Hembree et al. |
| 6,706,998 B2 | 3/2004 | Cutler |
| 6,759,275 B1 | 7/2004 | Lee et al. |
| 6,803,247 B2 | 10/2004 | Sekiya |
| 6,887,804 B2 | 5/2005 | Sun et al. |
| 6,998,571 B2 | 2/2006 | Sekiya et al. |
| 7,128,806 B2 | 10/2006 | Nguyen et al. |
| 7,129,150 B2 | 10/2006 | Kawai |
| 7,179,723 B2 | 2/2007 | Genda et al. |
| 7,265,033 B2 | 9/2007 | Shigematsu et al. |
| 7,364,986 B2 | 4/2008 | Nagai et al. |
| 7,435,607 B2 | 10/2008 | Nagai |
| 7,459,377 B2 | 12/2008 | Ueda et al. |
| 7,468,309 B2 | 12/2008 | Shigematsu et al. |
| 7,473,866 B2 | 1/2009 | Morishige et al. |
| 7,507,639 B2 | 3/2009 | Nakamura |
| 7,629,228 B2 | 12/2009 | Haji et al. |
| 7,678,670 B2 | 3/2010 | Arita et al. |
| 7,687,740 B2 | 3/2010 | Bruland et al. |
| 7,754,584 B2 | 7/2010 | Kumakawa |
| 7,767,551 B2 | 8/2010 | Arita et al. |
| 7,767,554 B2 | 8/2010 | Arita et al. |
| 7,776,720 B2 | 8/2010 | Boyle et al. |
| 7,838,323 B2 | 11/2010 | Utsumi et al. |
| 7,859,084 B2 | 12/2010 | Utsumi et al. |
| 7,875,898 B2 | 1/2011 | Maeda |
| 7,906,410 B2 * | 3/2011 | Arita et al. .................... 438/462 |
| 7,923,351 B2 | 4/2011 | Arita |
| 7,927,973 B2 | 4/2011 | Haji et al. |
| 2003/0162313 A1 | 8/2003 | Kim et al. |
| 2004/0080045 A1 | 4/2004 | Kimura et al. |
| 2004/0137700 A1 | 7/2004 | Sekiya |
| 2004/0259329 A1 | 12/2004 | Boyle et al. |
| 2006/0043535 A1 | 3/2006 | Hiatt |
| 2006/0205182 A1 | 9/2006 | Soejima |
| 2007/0272555 A1 | 11/2007 | Baird |
| 2009/0255911 A1 | 10/2009 | Krishnaswami et al. |
| 2010/0025387 A1 | 2/2010 | Arai et al. |
| 2011/0312157 A1 | 12/2011 | Lei et al. |

FOREIGN PATENT DOCUMENTS

| | | |
|---|---|---|
| JP | 10321908 | 12/1998 |
| JP | 2001127011 | 5/2001 |
| JP | 2001144126 | 5/2001 |
| JP | 2003179005 | 6/2003 |
| JP | 2004031526 | 1/2004 |
| JP | 2004055684 | 2/2004 |
| WO | WO-03036712 | 5/2003 |
| WO | WO-03071591 | 5/2003 |

OTHER PUBLICATIONS

Linder, V. et al., "Water-Soluble Sacrificial Layers for Surface Micromachining", www.small-journal.com, 2005, 1, No. 7, 7 Pages.

Singh, Saravjeet et al., "Apparatus and Methods for Dry Etch With Edge, Side and Back Protection", U.S. Appl. No. 61/491,693, filed May 31, 2011 24 pgs.

* cited by examiner

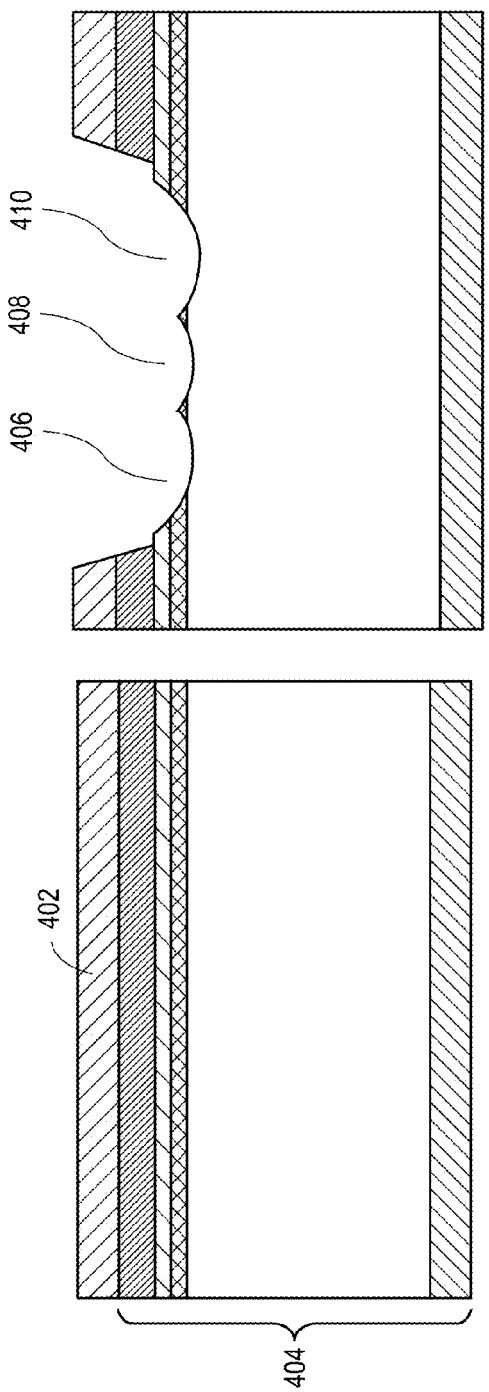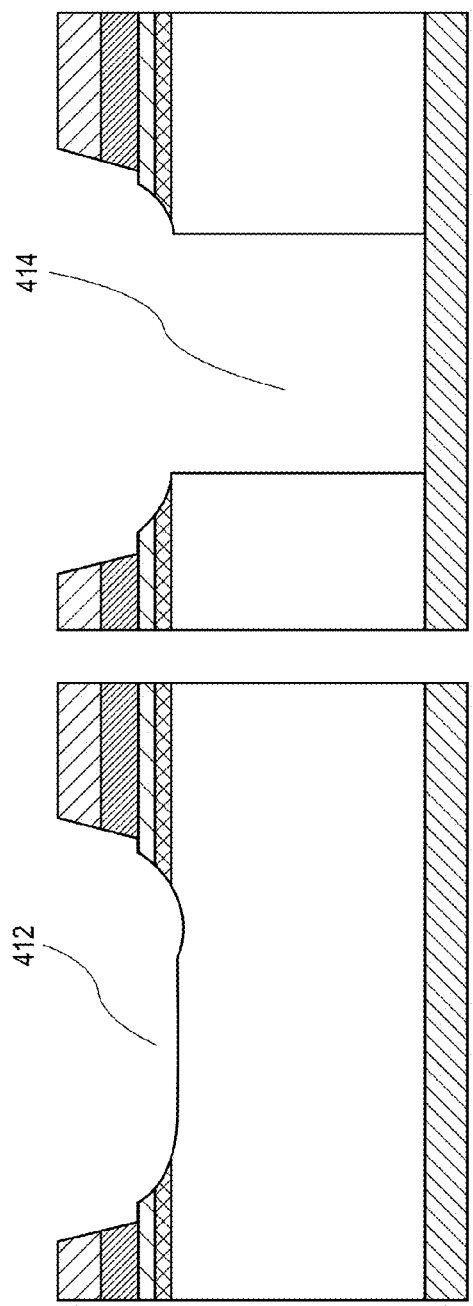
FIG. 4A  FIG. 4B  FIG. 4C  FIG. 4D

WAFER DICING USED HYBRID MULTI-STEP LASER SCRIBING PROCESS WITH PLASMA ETCH

CROSS-REFERENCE TO RELATED APPLICATIONS

This application claims the benefit of U.S. Provisional Application No. 61/622,398, filed Apr. 10, 2012, the entire contents of which are hereby incorporated by reference herein.

BACKGROUND

1) Field

Embodiments of the present invention pertain to the field of semiconductor processing and, in particular, to methods of dicing semiconductor wafers, each wafer having a plurality of integrated circuits thereon.

2) Description of Related Art

In semiconductor wafer processing, integrated circuits are formed on a wafer (also referred to as a substrate) composed of silicon or other semiconductor material. In general, layers of various materials which are either semiconducting, conducting or insulating are utilized to form the integrated circuits. These materials are doped, deposited and etched using various well-known processes to form integrated circuits. Each wafer is processed to form a large number of individual regions containing integrated circuits known as dice.

Following the integrated circuit formation process, the wafer is "diced" to separate the individual die from one another for packaging or for use in an unpackaged form within larger circuits. The two main techniques that are used for wafer dicing are scribing and sawing. With scribing, a diamond tipped scribe is moved across the wafer surface along pre-formed scribe lines. These scribe lines extend along the spaces between the dice. These spaces are commonly referred to as "streets." The diamond scribe forms shallow scratches in the wafer surface along the streets. Upon the application of pressure, such as with a roller, the wafer separates along the scribe lines. The breaks in the wafer follow the crystal lattice structure of the wafer substrate. Scribing can be used for wafers that are about 10 mils (thousandths of an inch) or less in thickness. For thicker wafers, sawing is presently the preferred method for dicing.

With sawing, a diamond tipped saw rotating at high revolutions per minute contacts the wafer surface and saws the wafer along the streets. The wafer is mounted on a supporting member such as an adhesive film stretched across a film frame and the saw is repeatedly applied to both the vertical and horizontal streets. One problem with either scribing or sawing is that chips and gouges can form along the severed edges of the dice. In addition, cracks can form and propagate from the edges of the dice into the substrate and render the integrated circuit inoperative. Chipping and cracking are particularly a problem with scribing because only one side of a square or rectangular die can be scribed in the <110> direction of the crystalline structure. Consequently, cleaving of the other side of the die results in a jagged separation line. Because of chipping and cracking, additional spacing is required between the dice on the wafer to prevent damage to the integrated circuits, e.g., the chips and cracks are maintained at a distance from the actual integrated circuits. As a result of the spacing requirements, not as many dice can be formed on a standard sized wafer and wafer real estate that could otherwise be used for circuitry is wasted. The use of a saw exacerbates the waste of real estate on a semiconductor wafer. The blade of the saw is approximate 15 microns thick. As such, to insure that cracking and other damage surrounding the cut made by the saw does not harm the integrated circuits, three to five hundred microns often must separate the circuitry of each of the dice. Furthermore, after cutting, each die requires substantial cleaning to remove particles and other contaminants that result from the sawing process.

Plasma dicing has also been used, but may have limitations as well. For example, one limitation hampering implementation of plasma dicing may be cost. A standard lithography operation for patterning resist may render implementation cost prohibitive. Another limitation possibly hampering implementation of plasma dicing is that plasma processing of commonly encountered metals (e.g., copper) in dicing along streets can create production issues or throughput limits.

SUMMARY

Embodiments of the present invention pertain to methods of, and apparatuses for, dicing semiconductor wafers or substrates.

In an embodiment, a method of dicing a semiconductor wafer having a plurality of integrated circuits involves forming a mask above the semiconductor wafer, the mask composed of a layer covering and protecting the integrated circuits. The method also involves patterning the mask with a multi-step laser scribing process to provide a patterned mask with gaps, exposing regions of the semiconductor wafer between the integrated circuits. The multi-step laser scribing process involves scribing with two or more offset but overlapping Gaussian beam passes and, subsequently, scribing with a top hat beam pass overlapping the Gaussian beam passes. The method also involves etching the semiconductor wafer through the gaps in the patterned mask to singulate the integrated circuits.

In another embodiment, a method of dicing a semiconductor wafer having a plurality of integrated circuits involves forming a mask above the semiconductor wafer, the mask composed of a layer covering and protecting the integrated circuits. The method also involves patterning the mask with a multi-step laser scribing process to provide a patterned mask with gaps, exposing regions of the semiconductor wafer between the integrated circuits. The multi-step laser scribing process involves scribing with two or more offset but overlapping Gaussian beam passes and, subsequently, scribing with a broad Gaussian beam pass overlapping the Gaussian beam passes. The method also involves etching the semiconductor wafer through the gaps in the patterned mask to singulate the integrated circuits.

In another embodiment, a method of dicing a semiconductor wafer having a plurality of integrated circuits involves forming a mask layer above a silicon substrate, the mask layer covering and protecting integrated circuits disposed on the silicon substrate. The integrated circuits include a layer of silicon dioxide disposed above a layer of low K material and a layer of copper. The method also involves patterning the mask layer, the layer of silicon dioxide, the layer of low K material, and the layer of copper with a multi-step laser scribing process to provide a patterned mask layer with gaps, exposing regions of the silicon substrate between the integrated circuits. The multi-step laser scribing process involves scribing with two or more offset but overlapping Gaussian beam passes and, subsequently, scribing with a top hat beam pass or with a broad Gaussian beam pass overlapping the Gaussian beam passes. The method also involves etching the silicon substrate through the gaps in the patterned mask layer to singulate the integrated circuits.

BRIEF DESCRIPTION OF THE DRAWINGS

FIGS. 4A-4D illustrate representative operations in a multi-step laser beam ablation process, in accordance with an embodiment of the present invention.

DETAILED DESCRIPTION

Figure 1:
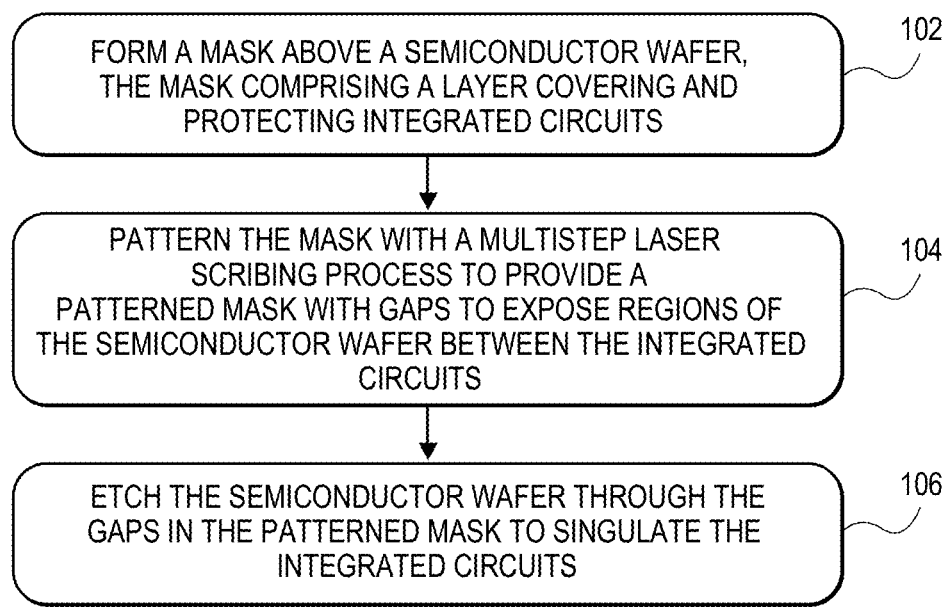
FIG. 1 is a Flowchart representing operations in a method of dicing a semiconductor wafer including a plurality of integrated circuits, in accordance with an embodiment of the present invention.

Methods of dicing semiconductor wafers, each wafer having a plurality of integrated circuits thereon, are described. In the following description, numerous specific details are set forth, such as multi-step laser scribing approaches and plasma etching conditions and material regimes, in order to provide a thorough understanding of embodiments of the present invention. It will be apparent to one skilled in the art that embodiments of the present invention may be practiced without these specific details. In other instances, well-known aspects, such as integrated circuit fabrication, are not described in detail in order to not unnecessarily obscure embodiments of the present invention. Furthermore, it is to be understood that the various embodiments shown in the Figures are illustrative representations and are not necessarily drawn to scale.

A hybrid wafer or substrate dicing process involving an initial laser scribe and subsequent plasma etch may be implemented for die singulation. The laser scribe process may be used to cleanly remove a mask layer, organic and inorganic dielectric layers, and device layers. The laser etch process may then be terminated upon exposure of, or partial etch of, the wafer or substrate. The plasma etch portion of the dicing process may then be employed to etch through the bulk of the wafer or substrate, such as through bulk single crystalline silicon, to yield die or chip singulation or dicing.

One or more embodiments described herein are directed to multi-step femto-send laser scribing of wafers. In one embodiment, a laser scribing plus plasma etch hybrid process is used to singulate integrated circuit (IC) chips from wafers. Other embodiments include MEMs wafer dicing. For a femtosecond laser scribing plus plasma etch hybrid process, a femtosecond laser may be used to cleanly remove a mask layer, organic and inorganic dielectric layers and device layers and etch stop layers. Subsequently, a plasma may be used to etch through a silicon layer to achieve chip singulation or dicing. The femtosecond laser based technology may have unique advantages when a wafer thickness is approximately 100 microns or thinner, especially around 50 microns or less. Femtosecond laser based technology may also have unique advantages when kerf width of around 15 microns or less is sought.

For IC memory chips, as memory capacity increases, multichip functions and continuous packaging miniaturization may require ultra thin wafer dicing. For logic device chips/processors, major challenges lie in IC performance increase, low k materials and other material adoption. Wafer thickness reduction such a case may not be a major driver and, typically, wafer thicknesses in the range of approximately 100 microns to 760 microns are used for major applications to ensure sufficient chip integrity. Processor chip designers/chip makers may place test element groups (TEGs or test patterns) as well as alignment patterns in wafer streets. On one hand, such test patterns may be completely removed during a chip singulation process. On the other hand, the complexity of the test patterns may dictate that the dimensions of the test patterns remain relatively large, typically in the 50 micron to 100 micron range perpendicular to the wafer street. A kerf width approximately in the range of 50 microns to 100 microns, at least at the top surface of the wafer, may thus be needed to completely remove the test patterns. As such, for logic device wafer singulation, a major focus is to achieve delamination-free and efficient dicing processes.

For diamond saw cutting based pure mechanical approach, when applied to low k wafer dicing, even with drastic speed reductions (e.g., down to 2 to 3 mm/sec from typically 40-100 mm/sec), chipping and delamination/crack formation due to mechanical stresses are typically unavoidable in most low-k wafer dicing. Pure laser ablation based dicing technology faces great challenges in throughput improvement, maintaining required die strength and side wall roughness, as well as reducing chances of delamination and chipouts when high power is used to address required throughput. Several hybrid technologies combine laser and the conventional dicing saw to address the low k wafers. First, a laser scribes through the top passivation and metal structures within the street, which the mechanical dicing saw has difficulties to cut through. Next, the saw is used to cut through the actual silicon (Si) substrate. Such a hybrid process may be very slow and typical mechanical sawing problems remain. For example, the wafer backside chipping inherent to the mechanical stress from diamond saw dicing still remains.

Furthermore, mitigation of laser induced front side chipping and delamination associated with low k dielectric stacks has been attempted. For example, a sealing ring has been placed surrounding each die to function as a barrier to propagation of interlayer dielectric and metal layers peeling/ delamination. Also, copper grids of certain copper density (e.g., typically 20-80%) in the form of squares called dummies or tiling is added under the passivation layer in the streets wherever there is an absence of alignment or test patterns. Such approaches have aided in suppressing the delamination and chipping. For wafers of 100 microns or thicker, when being diced, the rigidity may be sufficient to directly place the wafers on mounting tapes without die attach film (DAF) such that no DAF cutting process is involved.

Embodiments described herein may address dicing applications of IC wafers, especially with processor chips that have a thickness approximately in the range of 100 microns to 800 microns, and more particularly approximately in the range of 100 microns to 600 microns thickness, and an acceptable dicing kerf width approximately in the range of 50 microns to 200 microns, and more particularly approximately in the range of 50 microns to 100 microns, measured on wafer front surface (e.g., corresponding typical kerf width measured from back side of wafer is approximately 30-50 microns in a laser/saw hybrid process). One or more embodiments are directed to a hybrid laser scribing plus plasma etching approach to dice wafers as described above.

Figure 2A:
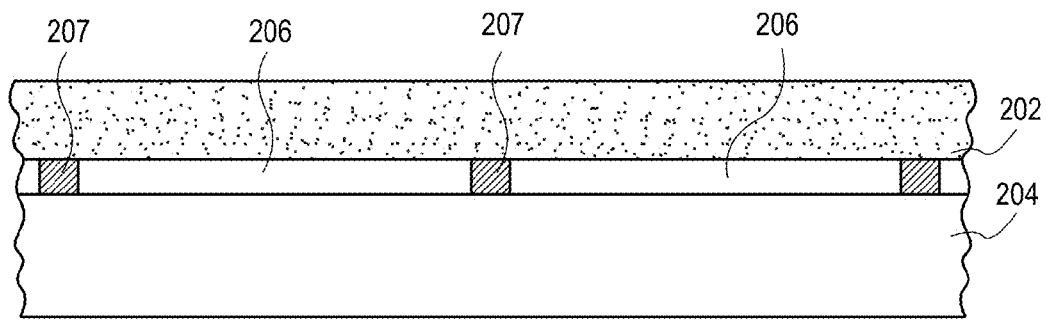
FIG. 2A illustrates a cross-sectional view of a semiconductor wafer including a plurality of integrated circuits during performing of a method of dicing the semiconductor wafer, corresponding to operation 102 of the Flowchart of FIG. 1, in accordance with an embodiment of the present invention.
Figure 2B:
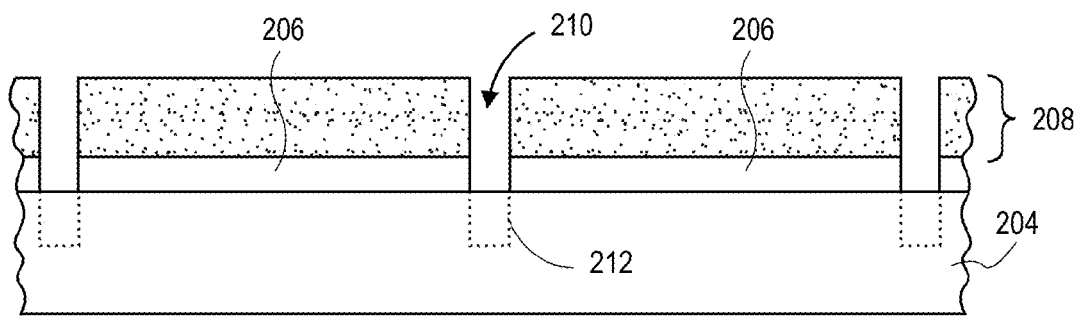
FIG. 2B illustrates a cross-sectional view of a semiconductor wafer including a plurality of integrated circuits during performing of a method of dicing the semiconductor wafer, corresponding to operation 104 of the Flowchart of FIG. 1, in accordance with an embodiment of the present invention.
Figure 2C:
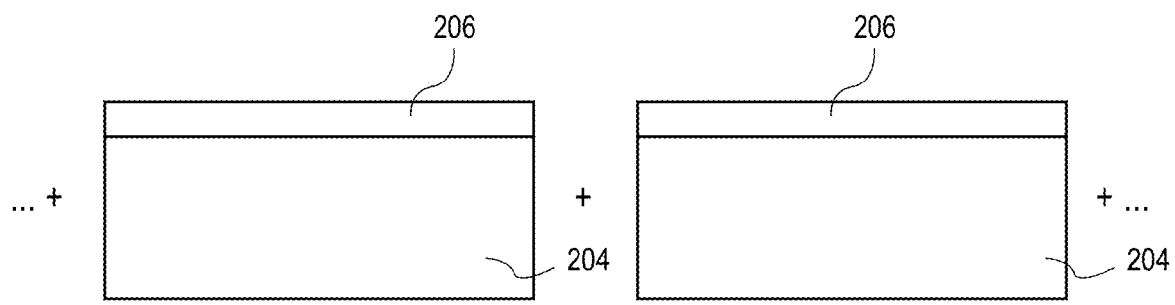
FIG. 2C illustrates a cross-sectional view of a semiconductor wafer including a plurality of integrated circuits during performing of a method of dicing the semiconductor wafer, corresponding to operation 106 of the Flowchart of FIG. 1, in accordance with an embodiment of the present invention.

Thus, in an aspect of the present invention, a combination of a multi-step laser scribing process with a plasma etching process may be used to dice a semiconductor wafer into singulated integrated circuits. FIG. 1 is a Flowchart 100 representing operations in a method of dicing a semiconductor wafer including a plurality of integrated circuits, in accordance with an embodiment of the present invention. FIGS. 2A-2C illustrate cross-sectional views of a semiconductor wafer including a plurality of integrated circuits during performing of a method of dicing the semiconductor wafer, corresponding to operations of Flowchart 100, in accordance with an embodiment of the present invention.

Referring to operation 102 of Flowchart 100, and corresponding FIG. 2A, a mask 202 is formed above a semiconductor wafer or substrate 204. The mask 202 is composed of a layer covering and protecting integrated circuits 206 formed on the surface of semiconductor wafer 204. The mask 202 also covers intervening streets 207 formed between each of the integrated circuits 206.

In accordance with an embodiment of the present invention, forming the mask 202 includes forming a layer such as, but not limited to, a photo-resist layer or an I-line patterning layer. For example, a polymer layer such as a photo-resist layer may be composed of a material otherwise suitable for use in a lithographic process. In one embodiment, the photo-resist layer is composed of a positive photo-resist material such as, but not limited to, a 248 nanometer (nm) resist, a 193 nm resist, a 157 nm resist, an extreme ultra-violet (EUV) resist, or a phenolic resin matrix with a diazonaphthoquinone sensitizer. In another embodiment, the photo-resist layer is composed of a negative photo-resist material such as, but not limited to, poly-cis-isoprene and poly-vinyl-cinnamate.

In an embodiment, semiconductor wafer or substrate 204 is composed of a material suitable to withstand a fabrication process and upon which semiconductor processing layers may suitably be disposed. For example, in one embodiment, semiconductor wafer or substrate 204 is composed of a group IV-based material such as, but not limited to, crystalline silicon, germanium or silicon/germanium. In a specific embodiment, providing semiconductor wafer 204 includes providing a monocrystalline silicon substrate. In a particular embodiment, the monocrystalline silicon substrate is doped with impurity atoms. In another embodiment, semiconductor wafer or substrate 204 is composed of a III-V material such as, e.g., a III-V material substrate used in the fabrication of light emitting diodes (LEDs).

In an embodiment, semiconductor wafer or substrate 204 has disposed thereon or therein, as a portion of the integrated circuits 206, an array of semiconductor devices. Examples of such semiconductor devices include, but are not limited to, memory devices or complimentary metal-oxide-semiconductor (CMOS) transistors fabricated in a silicon substrate and encased in a dielectric layer. A plurality of metal interconnects may be formed above the devices or transistors, and in surrounding dielectric layers, and may be used to electrically couple the devices or transistors to form the integrated circuits 206. Materials making up the streets 207 may be similar to or the same as those materials used to form the integrated circuits 206. For example, streets 207 may be composed of layers of dielectric materials, semiconductor materials, and metallization. In one embodiment, one or more of the streets 207 includes test devices similar to the actual devices of the integrated circuits 206.

Referring to operation 104 of Flowchart 100, and corresponding FIG. 2B, the mask 202 is patterned with a multi-step laser scribing process to provide a patterned mask 208 with gaps 210, exposing regions of the semiconductor wafer or substrate 204 between the integrated circuits 206. As such, the laser scribing process is used to remove the material of the streets 207 originally formed between the integrated circuits 206. In accordance with an embodiment of the present invention, patterning the mask 202 with the multi-step laser scribing process includes forming trenches 212 partially into the regions of the semiconductor wafer 204 between the integrated circuits 206, as depicted in FIG. 2B.

In an embodiment, the multi-step laser scribing process includes scribing with two or more offset but overlapping Gaussian beam passes and, subsequently, scribing with a top hat beam pass overlapping the Gaussian beam passes. In one such embodiment, the two or more offset but overlapping Gaussian beam passes are performed sequentially. In another such embodiment, the two or more offset but overlapping Gaussian beam passes are performed simultaneously. In an alternative embodiment, the overlapping Gaussian beam passes are followed instead by a subsequent Gaussian pass of a beam diameter and parameter set different from the initial offset Gaussian passes. For example, in one embodiment, a subsequent broad Gaussian approach using a properly defocused beam or a large focused beam may be used for the cleaning in place of a top hat beam.

In an embodiment, a multi-step laser scribing process includes a bulk target layer material removal. First, a solid state UV laser Gaussian beam is used to scribe the wafer surface to remove a mask layer, a passivation layer, and a device layer to the desired kerf width. The scribing process may be a single beam with multiple passes with each pass overlaps to certain level to the next pass in the direction normal to the laser scribing direction (or along with street width direction) to achieve a desired kerf width, or a single pass scribing via multiple beams. In either case, in one embodiment, the first aspect of the scribing process is used to completely remove test pattern features. The UV laser may have a wavelength approximately in the range of 250 nanometers to 400 nanometers, and more particularly approximately in the range of 300 nanometers to 380 nanometers. The pulse width may be approximately in the range of 1 picosecond to 50 nanoseconds, and more particularly approximately in the range of 5 picoseconds to 50 picoseconds. Such a pulse width range may not necessarily fully eliminate delamination and chipping, but at least may be used to control delamination and chipping near the scribed trench generated by not penetrating through a sealing rings of the individual dies. The focused laser spot diameter may be approximately in the range of 20 microns to 75 microns, and more particularly approximately in the range of 25 microns to 50 microns.

It is to be understood that it may be difficult to meet pulse energy requirements with a femtosecond laser as a larger laser spot is typically required. For example, if 2 microjoules (2 uJ) is needed for a 10 micron spot, the equivalent pulse energy for a 50 microns spot is (50/10)^2×2 uJ=50 uJ in order to maintain a same fluence or intensity. Such a proportionality may be very expensive to achieve on a femtosecond UV laser, but may be fairly inexpensive easy for a nanosecond or picosecond UV laser. In an embodiment, an approximately 10-20 micron or thicker mask layers is used for etching thick wafers. In an embodiment, the laser has a pulse repetition frequency approximately in the range of 80 kHz to 1 MHz, and particularly approximately in the range of 100 kHz to 500 kHz.

Throughout the above described first laser scribing operation, in one embodiment, most target materials are removed and silicon substrate is primarily exposed. However, due to the overlapping of multiple passes or multiple beams, heavy debris deposition on the opened substrate surface may not be directly etchable. Furthermore, the formed trench bottom surface may be quite rough.

Existing plasma etch technology has been focused on target material with a flat surface, since understanding of etch performance on a very rough surface may be limited. However, an etch rate (both directional and isotropic) may be homogeneous at different spots regardless of the surface topography (e.g., regardless if the surface is flat/smooth or rough). As such, the rough surface topography should be maintained as the formed trench is etched deeper. But in reality, in an embodiment, for a slightly rough surface, the surface is smoothened as etching proceeds. For a very rough surface, however, the etch depth at different location (trough or ridge locations) may be non-matching. Thus, in one embodiment, so long as the scribed surface is relatively smooth and free of debris, a good clean etch is achieved.

Accordingly, in an embodiment, following the bulk target layer material removal, a scribed trench cleaning operation is performed prior to etching. In one such embodiment, a top-hat spatial profiled solid state UV laser beam with the dimension (diameter in case of a round top hat beam or side length of a square top hat beam) approximately in the range of roughly 50 to 75% of the trench width opened in the first laser scribing operation is applied to gently clean and smoothen the trench surface as to remove the debris. Trench cleaning with a large top hat beam in a single pass may be important for the subsequent plasma etch characteristic. In one such embodiment, the trench opened via laser scribing has to be clean enough in order to achieve a consistently clean etched channel. Although a qualified trench for clean plasma etch may be generated in a single operation (with one or more passes) of laser scribing, in an embodiment, the laser-scribing-for-etching process is partitioned into two phases: phase 1 includes bulk removal of target material by laser ablation to form the trench, while phase is directed to trench cleaning to expose the silicon substrate uniformly and consistently by laser ablation. The post-laser scribing trench may be a fresh silicon surface free of metals, dielectrics and polymers. However, due to the wide kerf width generated with multiple passes/multiple beams, it may be conceived that the cross-contamination between the newly generated pass and the previous pass is unavoidable. Accordingly, it may not be feasible to use only a Gaussian beam to uniformly clean the wide trench without significantly melting the silicon substrate. In an embodiment, the subsequently used top hat beam is set at roughly 25%-50% of the average fluence of that used in the first (Gaussian) step, with a guideline that it may gently melt the silicon surface at maximum.

Figure 3:
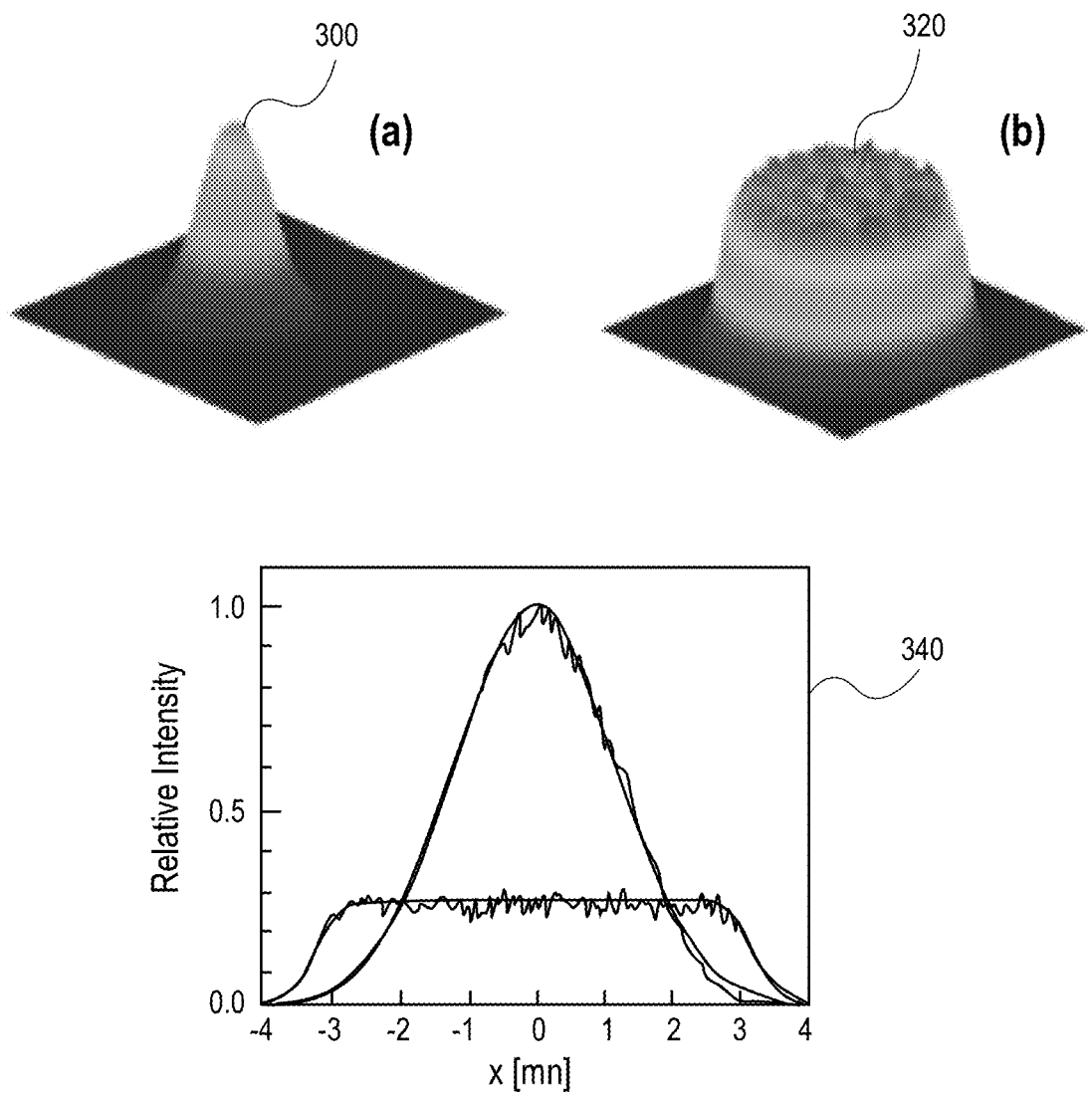
FIG. 3 illustrates a schematic of (a) a Gaussian beam profile and (b) a top hat beam profile, in accordance with an embodiment of the present invention.

In an example, FIG. 3 illustrates a schematic of (a) a Gaussian beam profile 300 and (b) a top hat beam profile 320, which are shown overlying one another in plot 340, in accordance with an embodiment of the present invention.

In another example, FIGS. 4A-4D illustrate representative operations in a multi-step laser beam ablation process, in accordance with an embodiment of the present invention. Referring to FIG. 4A, a water soluble mask 402 is applied to a wafer 404. Referring to FIG. 4B, a UV Gaussian beam is applied for bulk material removal. In this example, three passes 406, 408 and 410 are used. The three passes may be performed sequentially or simultaneously, and with the same or with different beams. Referring to FIG. 4C, a UV top hat beam trench cleaning operation is performed to provide a unified trench 412. Referring to FIG. 4D, a plasma etch is performed to provide a deep trench 414. Although not depicted, following the beam passes and the etch process, the water soluble mask 402 may then be washed away.

In an embodiment, the above described multi-step laser ablation process is used for dicing wafers having a thickness greater than approximately 100 microns. Advantages may include avoidance of back side chipping otherwise caused by diamond saw dicing (e.g., the average size of back side chipping in a laser+saw dicing process is approximately 20 microns versus the average size of backside chipping in a pure saw dicing is approximately 40 microns.) The plasma etching process that follows (examples of which are provided below) may enable higher overall process throughput compared to laser plus saw dicing. Furthermore, front side defects (such as chipping propagation due to mechanical stress generated by mechanical dicing) may be reduced. The adoption of a nanosecond or picosecond UV laser may enable ablation of very thick mask layers which may be necessary to carry the thick silicon etch process in addition to the polyimide layers and other layers on wafers since abundant pulse energy may be available on such lasers even at high frequency.

In some embodiments, it is desirable to form portions of multiple lines with a single scanner at a particular longitudinal position of a substrate or wafer undergoing singulation. Since the substrate or wafer may move longitudinally through the scribing device, in one embodiment, the scanner devices directs each beam laterally so as to form portions or segments of the latitudinal lines within the active area of each scanner device. In one embodiment, each scribe line is actually formed of a series of overlapping scribe dots, each being formed by a pulse of the laser directed to a particular position on the substrate or wafer. In order to form continuous lines, the dots may sufficiently overlap, such as by about 25% by area. Portions from each active area must then also overlap in order to prevent gaps. The overlap regions between dots formed by separate active areas may represent the beginning of each scan portion in a serpentine approach. In such an example, where there are x regions, if there are x scanner devices then the pattern can be formed via a single pass of the substrate or wafer through the device, as each scanning device can form one of the x overlapping portions and continuous lines can be thus be formed on a single pass. If, however, there are fewer scanning devices (e.g., one scanning device) than are necessary to form the number of regions, or the active areas are such that each scanning device is unable to scribe one of these segments, then the substrate may have to make multiple passes through the device.

In an embodiment, each scanning device scans according to a pattern at each of a plurality of longitudinal positions of the substrate or wafer. The patterns are used for a latitudinal region along a longitudinal direction, in order to form a segment of each of the scribe lines in a first longitudinal pass of the substrate or wafer through the device. A second segment of each line then is formed using the pattern in an opposite longitudinal pass of the substrate or wafer. The pattern is, in one embodiment, a serpentine pattern that allows multiple line segments to be formed by a scanning device for a given longitudinal position of the substrate or wafer. In one example, the patterns are made by a first scanner as the substrate or wafer travels through the device in a first longitudinal direction. That same scanner can utilize the pattern of when the substrate or wafer is then directed back in the opposite longitudinal direction, and so on, in order to form the sequential lines on the substrate or wafer.

It is to be understood that scribing may be performed using the same pattern in the same direction, such as when scribing does not occur when the substrate or wafer moves in the opposite longitudinal direction. Also, certain embodiments may move the substrate or wafer laterally between passes, while other embodiments may move the scanners, lasers, optical elements, or other components laterally relative to the substrate or wafer. Such a pattern may be used with one or multiple scanning devices.

In many embodiments, a latitudinal movement occurs for a set of line segments, then the substrate or wafer is moved longitudinally, then another latitudinal movement occurs to form another set, and so on. In many embodiments, the substrate or wafer moves longitudinally at a constant rate, such that the latitudinal movement back and forth requires different scribing patterns between latitudinal passes. These embodiments may result in an alternating of patterns.

Since the scribing for certain areas may occurs during latitudinal motion, however, a pattern may be used that accounts for this motion. If everything was stationary when scribing a portion, then a substantially rectangular pattern could be used at each position. In certain embodiments, motion is relatively continuous, however, as this approach minimizes errors due to stopping and starting, etc. When the system is moving laterally, a simple rectangular pattern approach may not result in substantially evenly-spaced and overlapping line portions.

Accordingly, scan patterns may be used that take into account this latitudinal movement. For example, for a serpentine pattern, if the position of the scanning device relative to the substrate or wafer is such that there is no longitudinal movement during latitudinal scanning, then the scanning device will have to account for the fact that the latitudinal position has changed since the scribing of the first line segment when starting the second line segment of the pattern. In one such embodiment, each pattern accounts for this by laterally offsetting the second line segment (and each subsequent line segment). The offset may be determined by, and calibrated to, the velocity of the latitudinal movement. The latitudinal motion can be due to movement of the scanning device, laser device, substrate or wafer, or a combination thereof. When the latitudinal motion is in the opposite direction, the patterns may have to account for latitudinal motion in the opposite direction and thus have an offset between line segments in the opposite direction.

While serpentine patterns can minimize the amount of scan travel, and in some embodiments might slightly improve throughput, other embodiments utilize patterns that always scan in the same latitudinal direction. For example, a pattern may compensate for lateral movement of the scanners, e.g., in a first direction. In such an example, however, the scan patterns may move left to right for this lateral movement, creating what is referred to herein as a raster pattern. While more motion of the scanner might be required between scribe lines, the scribing is in the same direction for a given direction of lateral motion, such that differences in scan patterns may not have to be calculated. For example, in a serpentine pattern a first line would be in a first direction that is the same as the motion of the scanner, so the spacing of the pattern would be a first distance. For the next line, if the formation of the line goes in the opposite direction against the direction of movement of the scanner, then a different pattern spacing may need to be calculated that takes into account the different direction (and change in relative velocity) of the substrate relative to the scanner. In order to avoid such calculations and calibrations, a raster pattern can be used that forms scribe lines with (or against) the direction of motion of the scanners.

Further, in an embodiment, since the active area or scan field for each scanning device is moving during scanning, the pattern that is scribed is less than the overall size of the scan field, and may be determined in part by the velocity of the motion. As a scan field is moved to the right relative to the substrate or wafer, the last line segment that is scribed will begin near the trailing edge of the scan field. When the first pattern is scribed, then the position of the scan field is in position to start with the next pattern. In order to ensure continuous lines, the end of the line segments of each pattern should, in one embodiment, overlap with the line segments of any adjacent line segments. In one embodiment, the overlap between scribe marks or scribe dots typically is on the order of about 25%. At the ends of the lines, however, the overlap may be greater, such as on the order of about 50%, in order to account for positioning errors between spots and to ensure stitching of the various line segments to form a continuous line.

In an exemplary embodiment, a scan field starts at one end of a serpentine pattern, and moves laterally to the right using alternating patterns (e.g., A, B, A, B, etc.) until reaching the end of the lines for that scanning device at that scribing position. At the end of the lines, the substrate or wafer is moved longitudinally to advance the scanning device to the next scribing position, and the latitudinal movement occurs in the opposite direction. In this direction, the opposing patterns are used (e.g., C, D, C, D, etc.) until reaching the end of the scan lines in this direction at this scribe position. As can be seen, each scan position results in a number of line segments being scribed, and a number of patterns stitched together to form longer line segments. An appropriate number can be used as would be apparent to one of ordinary skill in the art. The back and forth patterning is continued until reaching the end of the scribe area.

In an embodiment, a train of laser pulses may be used in reference to operation 104 of Flowchart 100. Depending on the complexity of layers being ablated, a train of single pulses may not provide optimal energy for ablation performance. However, delivering a greater intensity in a single pulse duration may lead to defect formation. Instead, in an embodiment, a train of multiple-pulse bursts is used for the ablation.

Even with the use of multi-step laser scribing, the use of a femtosecond-based laser (versus, e.g., a picoseconds-based laser or a nanosecond-based laser) may be used to further optimize ablation performance of a complex stack of layers undergoing a singulation process. Thus, in an embodiment, patterning the mask 206 with the laser scribing process includes using a laser having a pulse width in the femtosecond range. Specifically, a laser with a wavelength in the visible spectrum plus the ultra-violet (UV) and infra-red (IR) ranges (totaling a broadband optical spectrum) may be used to provide a femtosecond-based laser, i.e., a laser with a pulse width on the order of the femtosecond ($10^{-15}$ seconds). In one embodiment, ablation is not, or is essentially not, wavelength dependent and is thus suitable for complex films such as films of the mask 202, the streets 207 and, possibly, a portion of the semiconductor wafer or substrate 204.

Figure 5:
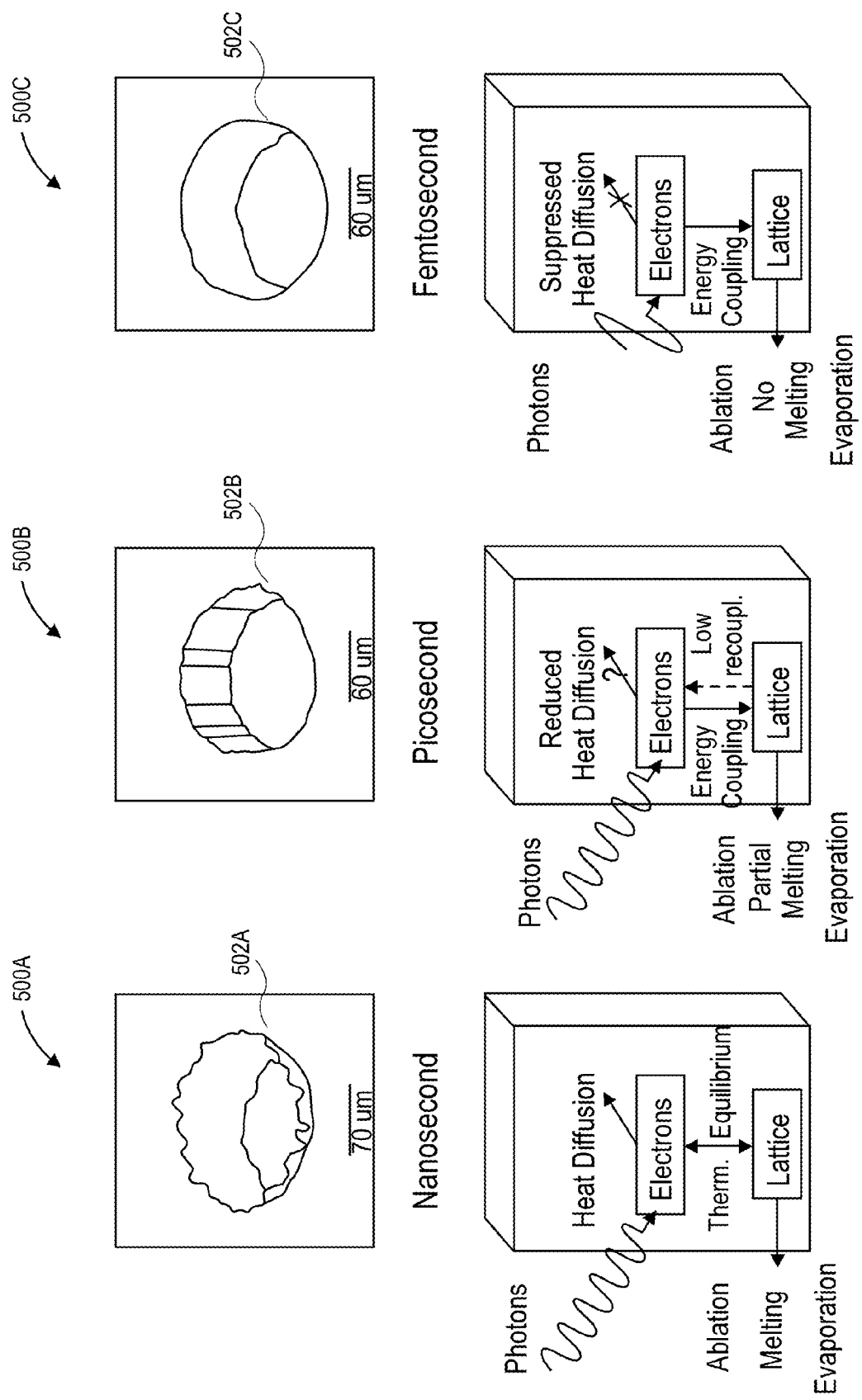
FIG. 5 illustrates the effects of using a laser pulse width in the femtosecond range versus longer pulse widths, in accordance with an embodiment of the present invention.

FIG. 5 illustrates the effects of using a laser pulse width in the femtosecond range versus longer pulse widths, in accordance with an embodiment of the present invention. Referring to FIG. 5, by using a laser pulse width in the femtosecond range heat damage issues are mitigated or eliminated (e.g., minimal to no damage 502C with femtosecond processing of a via 500C) versus longer pulse widths (e.g., damage 502B with picosecond processing of a via 500B and significant damage 502A with nanosecond processing of a via 500A). The elimination or mitigation of damage during formation of via 500C may be due to a lack of low energy recoupling (as is seen for picosecond-based laser ablation) or thermal equilibrium (as is seen for nanosecond-based laser ablation), as depicted in FIG. 5.

Laser parameters selection, such as pulse width, may be critical to developing a successful laser scribing and dicing process that minimizes chipping, microcracks and delamination in order to achieve clean laser scribe cuts. The cleaner the laser scribe cut, the smoother an etch process that may be performed for ultimate die singulation. In semiconductor device wafers, many functional layers of different material types (e.g., conductors, insulators, semiconductors) and thicknesses are typically disposed thereon. Such materials may include, but are not limited to, organic materials such as polymers, metals, or inorganic dielectrics such as silicon dioxide and silicon nitride.

A street between individual integrated circuits disposed on a wafer or substrate may include the similar or same layers as the integrated circuits themselves. For example, FIG. 6 illustrates a cross-sectional view of a stack of materials that may be used in a street region of a semiconductor wafer or substrate, in accordance with an embodiment of the present invention.

Figure 6:
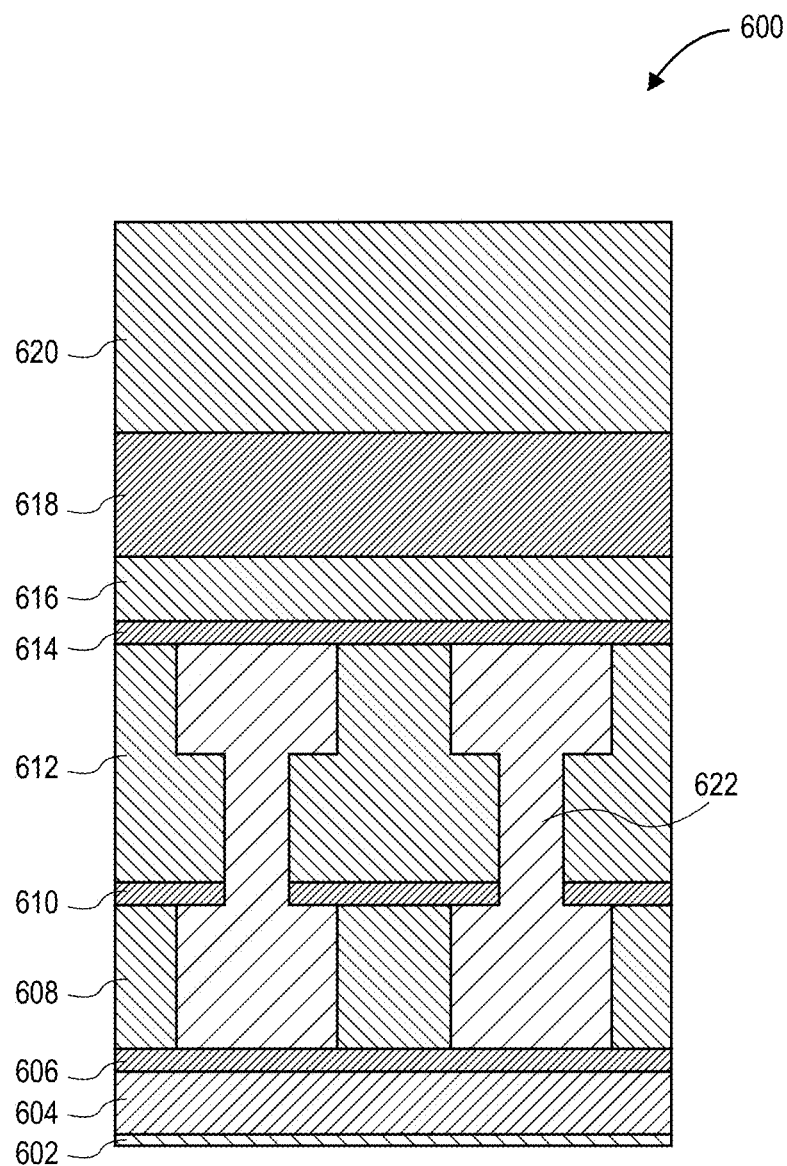
FIG. 6 illustrates a cross-sectional view of a stack of materials that may be used in a street region of a semiconductor wafer or substrate, in accordance with an embodiment of the present invention.

Referring to FIG. 6, a street region 600 includes the top portion 602 of a silicon substrate, a first silicon dioxide layer 604, a first etch stop layer 606, a first low K dielectric layer 608 (e.g., having a dielectric constant of less than the dielectric constant of 4.0 for silicon dioxide), a second etch stop layer 610, a second low K dielectric layer 612, a third etch stop layer 614, an undoped silica glass (USG) layer 616, a second silicon dioxide layer 618, and a layer of photo-resist 620, with relative thicknesses depicted. Copper metallization 622 is disposed between the first and third etch stop layers 606 and 614 and through the second etch stop layer 610. In a specific embodiment, the first, second and third etch stop layers 606, 610 and 614 are composed of silicon nitride, while low K dielectric layers 608 and 612 are composed of a carbon-doped silicon oxide material.

Under conventional laser irradiation (such as nanosecond-based or picosecond-based laser irradiation), the materials of street 600 behave quite differently in terms of optical absorption and ablation mechanisms. For example, dielectrics layers such as silicon dioxide, is essentially transparent to all commercially available laser wavelengths under normal conditions. By contrast, metals, organics (e.g., low K materials) and silicon can couple photons very easily, particularly in response to nanosecond-based or picosecond-based laser irradiation. In an embodiment, a multi-step laser scribing process is used to pattern a layer of silicon dioxide, a layer of low K material, and a layer of copper with a femtosecond-based laser scribing process by ablating the layer of silicon dioxide prior to ablating the layer of low K material and the layer of copper.

In accordance with an embodiment of the present invention, suitable femtosecond-based laser processes are characterized by a high peak intensity (irradiance) that usually leads to nonlinear interactions in various materials. In one such embodiment, the femtosecond laser sources have a pulse width approximately in the range of 10 femtoseconds to 500 femtoseconds, although preferably in the range of 100 femtoseconds to 400 femtoseconds. In one embodiment, the femtosecond laser sources have a wavelength approximately in the range of 1570 nanometers to 200 nanometers, although preferably in the range of 540 nanometers to 250 nanometers. In one embodiment, the laser and corresponding optical system provide a focal spot at the work surface approximately in the range of 3 microns to 15 microns, though preferably approximately in the range of 5 microns to 10 microns.

Laser parameters may be selected with benefits and advantages such as providing sufficiently high laser intensity to achieve ionization of inorganic dielectrics (e.g., silicon dioxide) and to minimize delamination and chipping caused by underlayer damage prior to direct ablation of inorganic dielectrics. Also, parameters may be selected to provide meaningful process throughput for industrial applications with precisely controlled ablation width (e.g., kerf width) and depth. As described above, a femtosecond-based laser is far more suitable to providing such advantages, as compared with picosecond-based and nanosecond-based laser ablation processes.

However, even in the spectrum of femtosecond-based laser ablation, certain wavelengths may provide better performance than others. For example, in one embodiment, a femtosecond-based laser process having a wavelength closer to or in the UV range provides a cleaner ablation process than a femtosecond-based laser process having a wavelength closer to or in the IR range. In a specific such embodiment, a femtosecond-based laser process suitable for semiconductor wafer or substrate scribing is based on a laser having a wavelength of approximately less than or equal to 540 nanometers. In a particular such embodiment, pulses of approximately less than or equal to 400 femtoseconds of the laser having the wavelength of approximately less than or equal to 540 nanometers are used. However, in an alternative embodiment, dual laser wavelengths (e.g., a combination of an IR laser and a UV laser) are used.

Referring to operation 106 of Flowchart 100, and corresponding FIG. 2C, the semiconductor wafer 204 is etched through the gaps 210 in the patterned mask 208 to singulate the integrated circuits 206. In accordance with an embodiment of the present invention, etching the semiconductor wafer 204 includes ultimately etching entirely through semiconductor wafer 204, as depicted in FIG. 2C, by etching the trenches 212 initially formed with the multi-step laser scribing process.

In an embodiment, etching the semiconductor wafer 204 includes using a plasma etching process. In one embodiment, a through-silicon via type etch process is used. For example, in a specific embodiment, the etch rate of the material of semiconductor wafer 204 is greater than 25 microns per minute. An ultra-high-density plasma source may be used for the plasma etching portion of the die singulation process. An example of a process chamber suitable to perform such a plasma etch process is the Applied Centura® Silvia™ Etch system available from Applied Materials of Sunnyvale, Calif., USA. The Applied Centura® Silvia™ Etch system combines the capacitive and inductive RF coupling, which gives much more independent control of the ion density and ion energy than was possible with the capacitive coupling only, even with the improvements provided by magnetic enhancement. This combination enables effective decoupling of the ion density from ion energy, so as to achieve relatively high density plasmas without the high, potentially damaging, DC bias levels, even at very low pressures. This results in an exceptionally wide process window. However, any plasma etch chamber capable of etching silicon may be used. In an exemplary embodiment, a deep silicon etch is used to etch a single crystalline silicon substrate or wafer 404 at an etch rate greater than approximately 40% of conventional silicon etch rates while maintaining essentially precise profile control and virtually scallop-free sidewalls. In a specific embodiment, a through-silicon via type etch process is used. The etch process is based on a plasma generated from a reactive gas, which generally is a fluorine-based gas such as $SF_6$, $C_4F_8$, $CHF_3$, $XeF_2$, or any other reactant gas capable of etching silicon at a relatively fast etch rate. In an embodiment, the mask layer 208 is removed after the singulation process, as depicted in FIG. 2C.

Accordingly, referring again to Flowchart 100 and FIGS. 2A-2C, wafer dicing may be preformed by initial ablation using a multi-step laser scribing process to ablate through a mask layer, through wafer streets (including metallization), and partially into a silicon substrate. Die singulation may then be completed by subsequent through-silicon deep plasma etching. A specific example of a materials stack for dicing is described below in association with FIGS. 7A-7D, in accordance with an embodiment of the present invention.

Figure 7A:
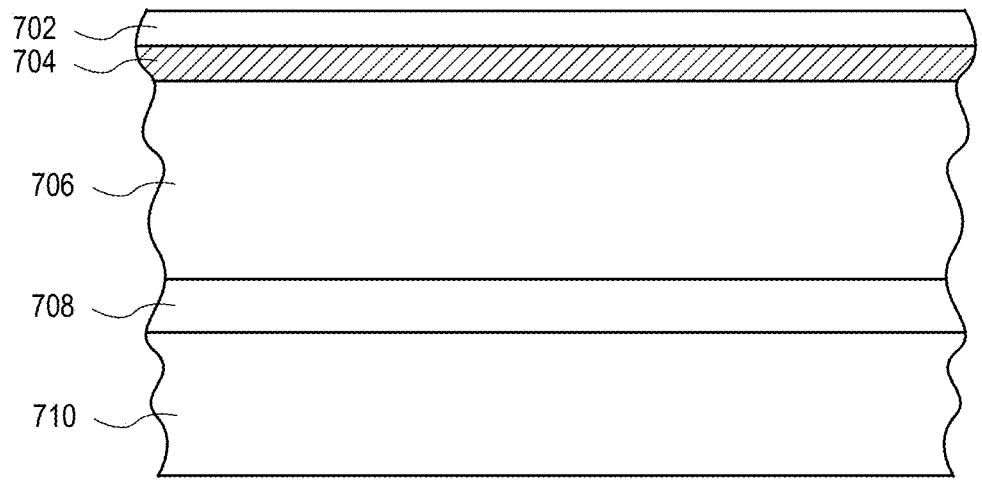
FIGS. 7A-7D illustrate cross-sectional views of various operations in a method of dicing a semiconductor wafer, in accordance with an embodiment of the present invention.

Referring to FIG. 7A, a materials stack for hybrid laser ablation and plasma etch dicing includes a mask layer 702, a device layer 704, and a substrate 706. The mask layer, device layer, and substrate are disposed above a die attach film 708 which is affixed to a backing tape 710. In an embodiment, the mask layer 702 is a photo-resist layer such as the photo-resist layers described above in association with mask 202. The device layer 704 includes an inorganic dielectric layer (such as silicon dioxide) disposed above one or more metal layers (such as copper layers) and one or more low K dielectric layers (such as carbon-doped oxide layers). The device layer 704 also includes streets arranged between integrated circuits, the streets including the same or similar layers to the integrated circuits. The substrate 706 is a bulk single-crystalline silicon substrate.

In an embodiment, the bulk single-crystalline silicon substrate 706 is thinned from the backside prior to being affixed to the die attach film 708. The thinning may be performed by a backside grind process. In one embodiment, the bulk single-crystalline silicon substrate 706 is thinned to a thickness approximately in the range of 50-100 microns. It is important to note that, in an embodiment, the thinning is performed prior to a laser ablation and plasma etch dicing process. In an embodiment, the photo-resist layer 702 has a thickness of approximately 5 microns and the device layer 704 has a thickness approximately in the range of 2-3 microns. In an embodiment, the die attach film 708 (or any suitable substitute capable of bonding a thinned or thin wafer or substrate to the backing tape 710) has a thickness of approximately 20 microns.

Figure 7B:
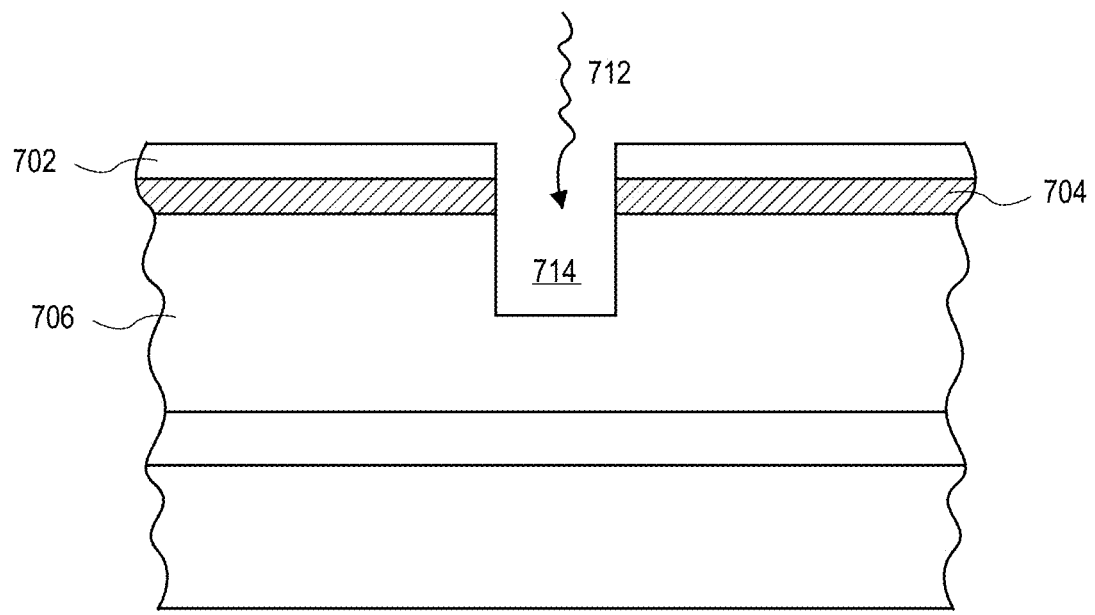
Figure 7C:
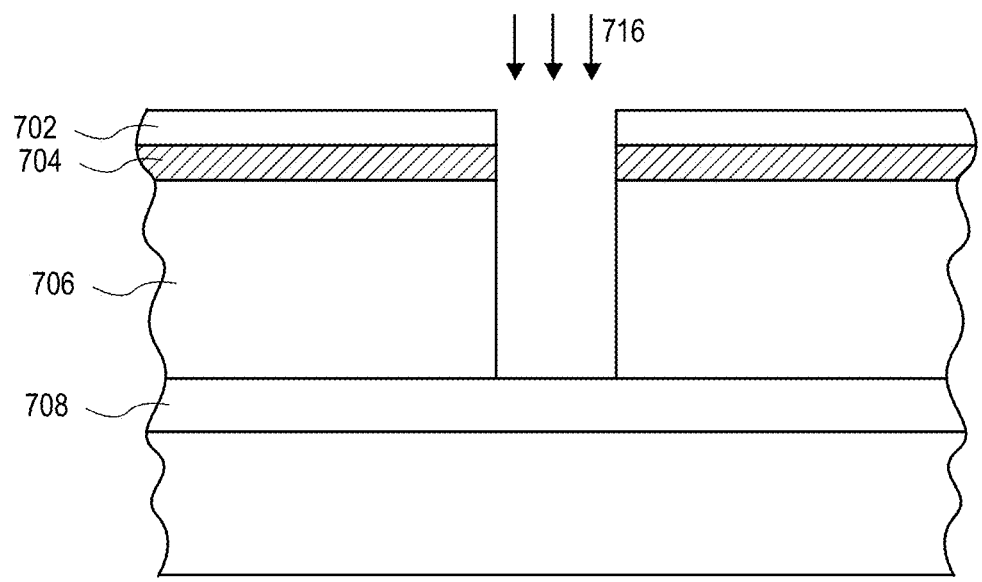

Referring to FIG. 7B, the mask 702, the device layer 704 and a portion of the substrate 706 are patterned with a multi-step laser scribing process 712 to form trenches 714 in the substrate 706. Referring to FIG. 7C, a through-silicon deep plasma etch process 716 is used to extend the trench 714 down to the die attach film 708, exposing the top portion of the die attach film 708 and singulating the silicon substrate 706. The device layer 704 is protected by the photo-resist layer 702 during the through-silicon deep plasma etch process 716.

Figure 7D:
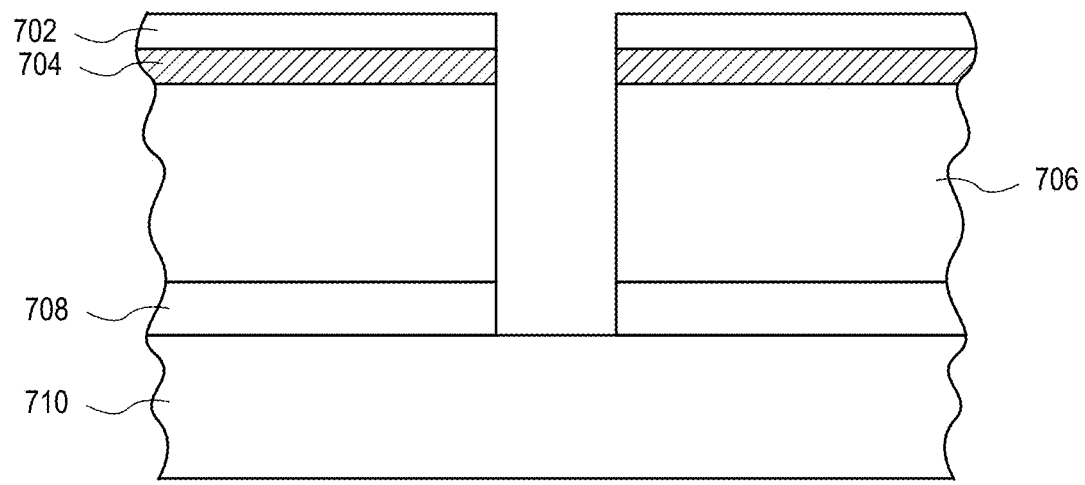

Referring to FIG. 7D, the singulation process may further include patterning the die attach film 708, exposing the top portion of the backing tape 710 and singulating the die attach film 708. In an embodiment, the die attach film is singulated by a laser process or by an etch process. Further embodiments may include subsequently removing the singulated portions of substrate 706 (e.g., as individual integrated circuits) from the backing tape 710. In one embodiment, the singulated die attach film 708 is retained on the back sides of the singulated portions of substrate 706. Other embodiments may include removing the masking photo-resist layer 702 from the device layer 704. In an alternative embodiment, in the case that substrate 706 is thinner than approximately 50 microns, the laser ablation process 712 is used to completely singulate substrate 706 without the use of an additional plasma process.

Subsequent to singulating the die attach film 708, in an embodiment, the masking photo-resist layer 702 is removed from the device layer 704. In an embodiment, the singulated integrated circuits are removed from the backing tape 710 for packaging. In one such embodiment, the patterned die attach film 708 is retained on the backside of each integrated circuit and included in the final packaging. However, in another embodiment, the patterned die attach film 708 is removed during or subsequent to the singulation process.

A single process tool may be configured to perform many or all of the operations in a hybrid multi-step laser ablation and plasma etch singulation process. For example, FIG. 8 illustrates a block diagram of a tool layout for laser and plasma dicing of wafers or substrates, in accordance with an embodiment of the present invention.

Figure 8:
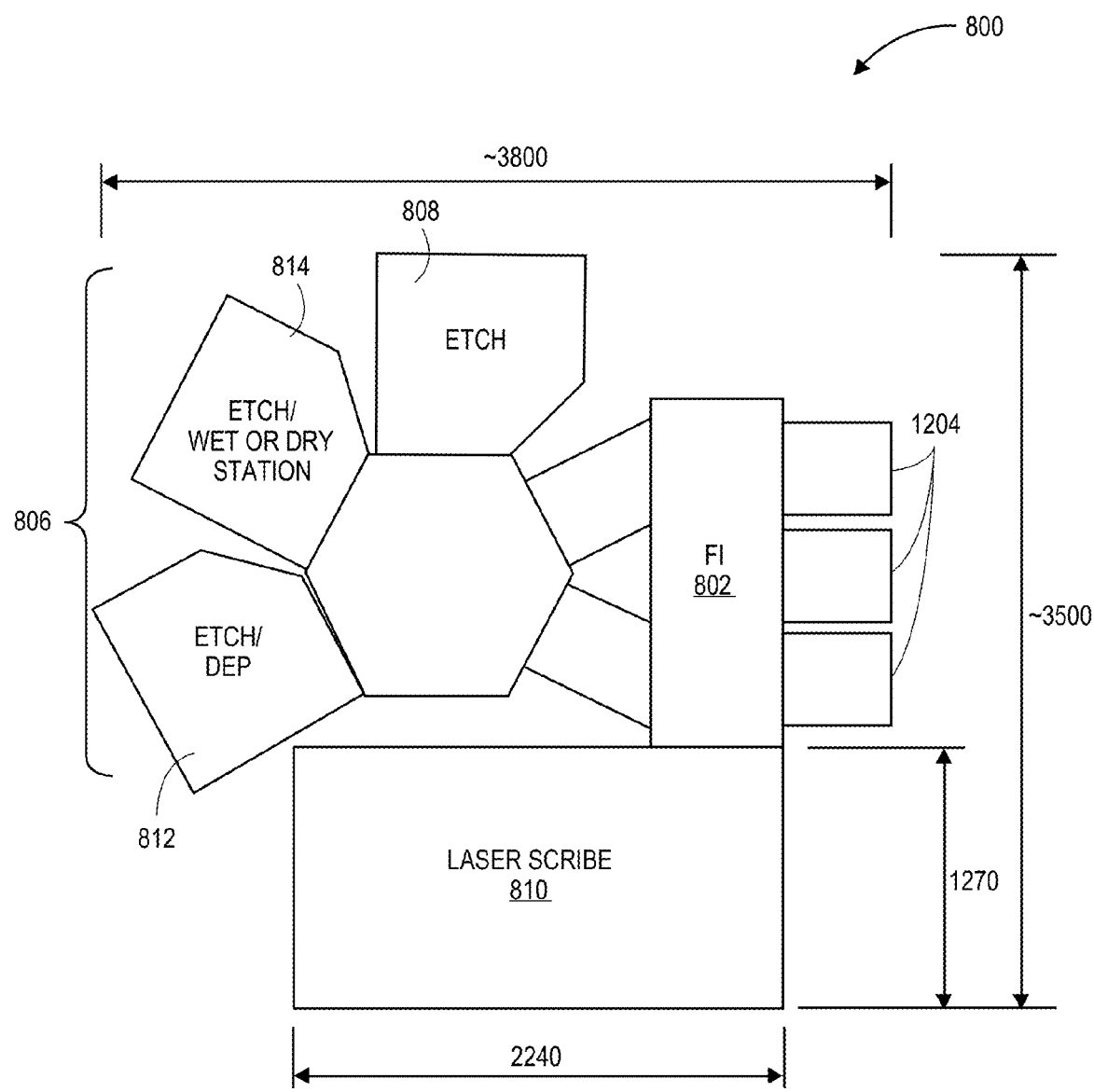
FIG. 8 illustrates a block diagram of a tool layout for laser and plasma dicing of wafers or substrates, in accordance with an embodiment of the present invention.

Referring to FIG. 8, a process tool 800 includes a factory interface 802 (FI) having a plurality of load locks 804 coupled therewith. A cluster tool 806 is coupled with the factory interface 802. The cluster tool 806 includes one or more plasma etch chambers, such as plasma etch chamber 808. A laser scribe apparatus 810 is also coupled to the factory interface 802. The overall footprint of the process tool 800 may be, in one embodiment, approximately 3500 millimeters (3.5 meters) by approximately 3800 millimeters (3.8 meters), as depicted in FIG. 8.

In an embodiment, the laser scribe apparatus 810 houses a laser apparatus configured to perform a multi-step laser scribing process. The laser is suitable for performing a laser ablation portion of a hybrid laser and etch singulation process, such as the laser abalation processes described above. In one embodiment, a moveable stage is also included in laser scribe apparatus 810, the moveable stage configured for moving a wafer or substrate (or a carrier thereof) relative to the laser. In a specific embodiment, as described above the laser is also moveable. The overall footprint of the laser scribe apparatus 810 may be, in one embodiment, approximately 2240 millimeters by approximately 1270 millimeters, as depicted in FIG. 8.

In an embodiment, the laser scribe apparatus 810 includes a power-attenuation aperture placed along each beam path to finely adjust laser power and beam size. In an embodiment, an attenuating element is placed along each beam path to attenuate the beam portion, adjusting an intensity or strength of the pulses in that portion. In an embodiment, a shutter is placed along each beam path to control the shape of each pulse of the beam portion.

In an embodiment, the one or more plasma etch chambers 808 is configured for etching a wafer or substrate through the gaps in a patterned mask to singulate a plurality of integrated circuits. In one such embodiment, the one or more plasma etch chambers 808 is configured to perform a deep silicon etch process. In a specific embodiment, the one or more plasma etch chambers 808 is an Applied Centura® Silvia™ Etch system, available from Applied Materials of Sunnyvale, Calif., USA. The etch chamber may be specifically designed for a deep silicon etch used to create singulate integrated circuits housed on or in single crystalline silicon substrates or wafers. In an embodiment, a high-density plasma source is included in the plasma etch chamber 808 to facilitate high silicon etch rates. In an embodiment, more than one etch chamber is included in the cluster tool 806 portion of process tool 800 to enable high manufacturing throughput of the singulation or dicing process.

The factory interface 802 may be a suitable atmospheric port to interface between an outside manufacturing facility with laser scribe apparatus 810 and cluster tool 806. The factory interface 802 may include robots with arms or blades for transferring wafers (or carriers thereof) from storage units (such as front opening unified pods) into either cluster tool 806 or laser scribe apparatus 810, or both.

Cluster tool 806 may include other chambers suitable for performing functions in a method of singulation. For example, in one embodiment, in place of an additional etch chamber, a deposition chamber 812 is included. The deposition chamber 812 may be configured for mask deposition on or above a device layer of a wafer or substrate prior to laser scribing of the wafer or substrate. In one such embodiment, the deposition chamber 812 is suitable for depositing a photo-resist layer. In another embodiment, in place of an additional etch chamber, a wet/dry station 814 is included. The wet/dry station may be suitable for cleaning residues and fragments, or for removing a mask, subsequent to a laser scribe and plasma etch singulation process of a substrate or wafer. In an embodiment, a metrology station is also included as a component of process tool 800.

Embodiments of the present invention may be provided as a computer program product, or software, that may include a machine-readable medium having stored thereon instructions, which may be used to program a computer system (or other electronic devices) to perform a process according to embodiments of the present invention. In one embodiment, the computer system is coupled with process tool 800 described in association with FIG. 8. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 9:
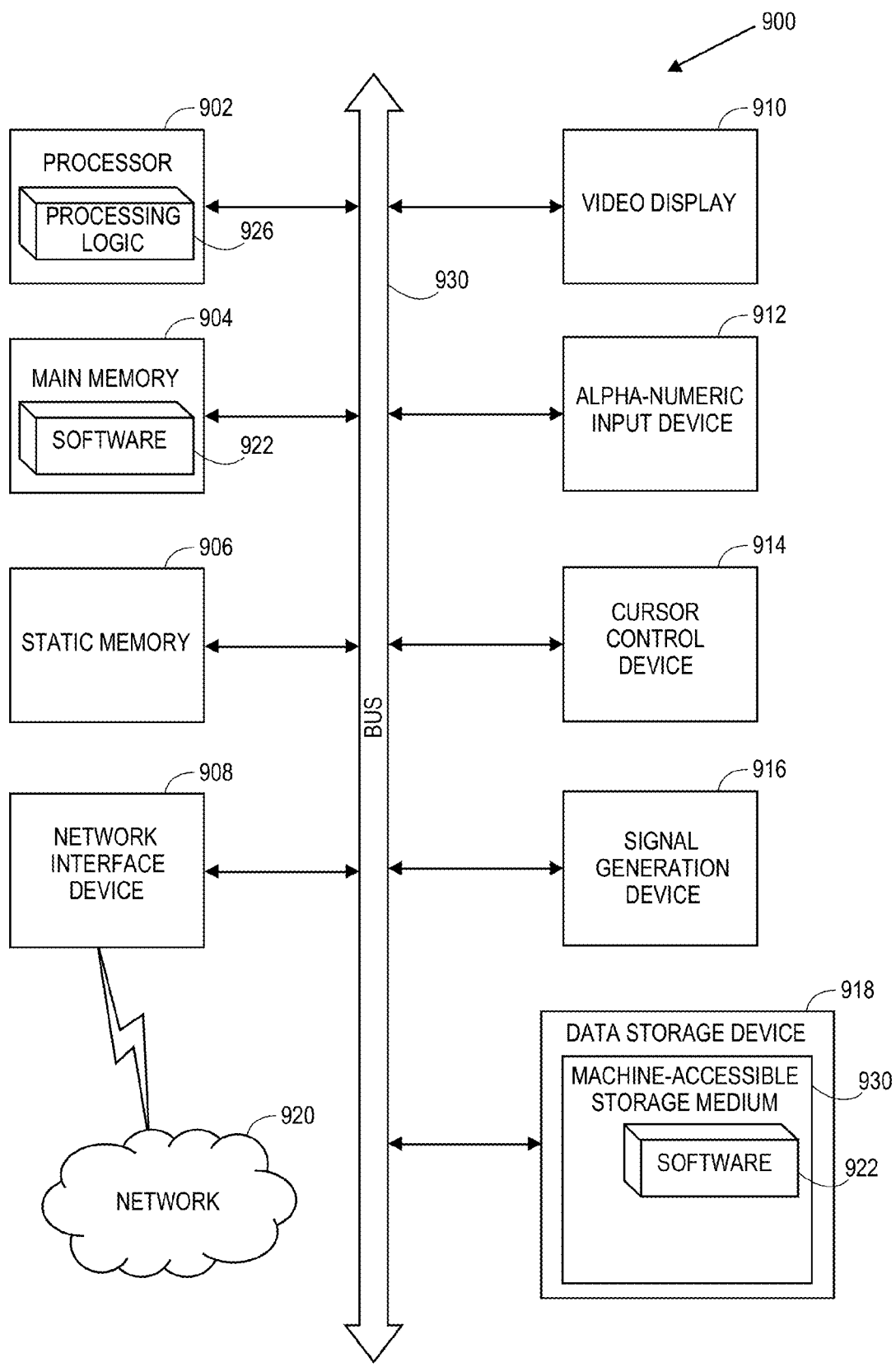
FIG. 9 illustrates a block diagram of an exemplary computer system, in accordance with an embodiment of the present invention.

FIG. 9 illustrates a diagrammatic representation of a machine in the exemplary form of a computer system 900 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 900 includes a processor 902, a main memory 904 (e.g., read-only memory (ROM), flash memory, dynamic random access memory (DRAM) such as synchronous DRAM (SDRAM) or Rambus DRAM (RDRAM), etc.), a static memory 906 (e.g., flash memory, static random access memory (SRAM), etc.), and a secondary memory 918 (e.g., a data storage device), which communicate with each other via a bus 930.

Processor 902 represents one or more general-purpose processing devices such as a microprocessor, central processing unit, or the like. More particularly, the processor 902 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 902 may also be one or more special-purpose processing devices such as an application specific integrated circuit (ASIC), a field programmable gate array (FPGA), a digital signal processor (DSP), network processor, or the like. Processor 902 is configured to execute the processing logic 926 for performing the operations described herein.

The computer system 900 may further include a network interface device 908. The computer system 900 also may include a video display unit 910 (e.g., a liquid crystal display (LCD), a light emitting diode display (LED), or a cathode ray tube (CRT)), an alphanumeric input device 912 (e.g., a keyboard), a cursor control device 914 (e.g., a mouse), and a signal generation device 916 (e.g., a speaker).

The secondary memory 918 may include a machine-accessible storage medium (or more specifically a computer-readable storage medium) 931 on which is stored one or more sets of instructions (e.g., software 922) embodying any one or more of the methodologies or functions described herein. The software 922 may also reside, completely or at least partially, within the main memory 904 and/or within the processor 902 during execution thereof by the computer system 900, the main memory 904 and the processor 902 also constituting machine-readable storage media. The software 922 may further be transmitted or received over a network 920 via the network interface device 908.

While the machine-accessible storage medium 931 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

In accordance with an embodiment of the present invention, a machine-accessible storage medium has instructions stored thereon which cause a data processing system to perform a method of dicing a semiconductor wafer having a plurality of integrated circuits. The method includes forming a mask above the semiconductor wafer, the mask composed of a layer covering and protecting the integrated circuits. The mask is then patterned with a multi-step laser scribing process to provide a patterned mask with gaps. Regions of the semiconductor wafer are exposed between the integrated circuits. The semiconductor wafer is then etched through the gaps in the patterned mask to singulate the integrated circuits.

Thus, methods of dicing semiconductor wafers, each wafer having a plurality of integrated circuits, have been disclosed. In accordance with an embodiment of the present invention, a method includes dicing a semiconductor wafer having a plurality of integrated circuits includes forming a mask above the semiconductor wafer, the mask composed of a layer covering and protecting the integrated circuits. The method also includes patterning the mask with a multi-step laser scribing process to provide a patterned mask with gaps, exposing regions of the semiconductor wafer between the integrated circuits. The method also includes etching the semiconductor wafer through the gaps in the patterned mask to singulate the integrated circuits. In one embodiment, the multi-step laser scribing process includes scribing with two or more offset but overlapping Gaussian beam passes and, subsequently, scribing with a top hat beam pass overlapping the Gaussian beam passes.

What is claimed is:

1. A method of dicing a semiconductor wafer comprising a plurality of integrated circuits, the method comprising:
    forming a mask above the semiconductor wafer, the mask comprising a layer covering and protecting the integrated circuits;
    patterning the mask with a multi-step laser scribing process to provide a patterned mask with gaps, exposing regions of the semiconductor wafer between the integrated circuits, the multi-step laser scribing process comprising:
        scribing with two or more offset but overlapping Gaussian beam passes; and, subsequently,
        scribing with a top hat beam pass overlapping the Gaussian beam passes; and
    etching the semiconductor wafer through the gaps in the patterned mask to singulate the integrated circuits.

2. The method of claim 1, wherein the two or more offset but overlapping Gaussian beam passes are performed sequentially.

3. The method of claim 1, wherein the two or more offset but overlapping Gaussian beam passes are performed simultaneously.

4. The method of claim 1, wherein each of the two or more offset but overlapping Gaussian beam passes are performed using a UV laser having a wavelength approximately in the range of 300-380 nanometers.

5. The method of claim 1, wherein each of the two or more offset but overlapping Gaussian beam passes are performed using a UV laser having a pulse width approximately in the range of 5-50 picoseconds.

6. The method of claim 1, wherein each of the two or more offset but overlapping Gaussian beam passes are performed using a UV laser having a laser spot diameter approximately in the range of 25-50 microns.

7. The method of claim 1, wherein the top hat beam pass is performed at approximately 25%-50% of the average fluence of the Gaussian beam passes.

8. The method of claim 1, wherein forming the mask above the semiconductor wafer comprises forming a water soluble mask.

9. A method of dicing a semiconductor wafer comprising a plurality of integrated circuits, the method comprising:
    forming a mask above the semiconductor wafer, the mask comprising a layer covering and protecting the integrated circuits;
    patterning the mask with a multi-step laser scribing process to provide a patterned mask with gaps, exposing regions of the semiconductor wafer between the integrated circuits, the multi-step laser scribing process comprising:
        scribing with two or more offset but overlapping Gaussian beam passes; and, subsequently,
        scribing with a broad Gaussian beam pass overlapping the offset Gaussian beam passes; and
    etching the semiconductor wafer through the gaps in the patterned mask to singulate the integrated circuits.

10. The method of claim 9, wherein the two or more offset but overlapping Gaussian beam passes are performed sequentially.

11. The method of claim 9, wherein the two or more offset but overlapping Gaussian beam passes are performed simultaneously.

12. The method of claim 9, wherein each of the two or more offset but overlapping Gaussian beam passes are performed using a UV laser having a wavelength approximately in the range of 300-380 nanometers.

13. The method of claim 9, wherein each of the two or more offset but overlapping Gaussian beam passes are performed using a UV laser having a pulse width approximately in the range of 5-50 picoseconds.

14. The method of claim 9, wherein each of the two or more offset but overlapping Gaussian beam passes are performed using a UV laser having a laser spot diameter approximately in the range of 25-50 microns.

15. The method of claim 9, wherein forming the mask above the semiconductor wafer comprises forming a water soluble mask.

16. A method of dicing a semiconductor wafer comprising a plurality of integrated circuits, the method comprising:
    forming a mask layer above a silicon substrate, the mask layer covering and protecting integrated circuits disposed on the silicon substrate, the integrated circuits comprising a layer of silicon dioxide disposed above a layer of low K material and a layer of copper;
    patterning the mask layer, the layer of silicon dioxide, the layer of low K material, and the layer of copper with a multi-step laser scribing process to provide a patterned mask layer with gaps, exposing regions of the silicon substrate between the integrated circuits, the multi-step laser scribing process comprising:
        scribing with two or more offset but overlapping Gaussian beam passes; and, subsequently,
        scribing with a top hat beam pass or with a broad Gaussian beam pass overlapping the Gaussian beam passes; and
    etching the silicon substrate through the gaps in the patterned mask layer to singulate the integrated circuits.

17. The method of claim 16, wherein patterning the layer of silicon dioxide, the layer of low K material, and the layer of copper with the multi-step laser scribing process comprises ablating the layer of silicon dioxide prior to ablating the layer of low K material and the layer of copper.

18. The method of claim 16, wherein the two or more offset but overlapping Gaussian beam passes are performed sequentially.

19. The method of claim 16, wherein the two or more offset but overlapping Gaussian beam passes are performed simultaneously.

20. The method of claim 16, wherein forming the mask layer above the silicon substrate comprises forming a water soluble mask layer.

\* \* \* \* \*